United States Patent [19]

Ballato

[11] Patent Number: 4,631,437

[45] Date of Patent: Dec. 23, 1986

[54] STRESS COMPENSATED PIEZOELECTRIC CRYSTAL DEVICE

[75] Inventor: Arthur Ballato, Long Branch, N.J.

[73] Assignee: The United States of America as represented by the Secretary of the Army, Washington, D.C.

[21] Appl. No.: 690,358

[22] Filed: Jan. 10, 1985

[51] Int. Cl.⁴ .................................... H01L 41/08
[52] U.S. Cl. ..................... 310/369; 310/361; 310/348; 310/346
[58] Field of Search ............... 310/361, 360, 367–369, 310/346, 348

[56] References Cited

U.S. PATENT DOCUMENTS

| | | | |
|---|---|---|---|
| 2,161,980 | 6/1939 | Runge et al. | 310/369 X |
| 3,069,572 | 12/1962 | Dick et al. | 310/353 |
| 3,339,091 | 8/1967 | Hammond et al. | 310/346 |
| 3,561,832 | 2/1971 | Karrer et al. | 310/346 X |
| 4,135,108 | 1/1979 | Besson | 310/361 X |
| 4,221,986 | 9/1980 | Besson | 310/346 X |
| 4,357,554 | 11/1982 | Peters | 310/346 X |
| 4,454,443 | 6/1984 | Lukaszek et al. | 310/354 X |
| 4,464,598 | 8/1984 | Besson | 310/346 X |

OTHER PUBLICATIONS

Force-Frequency Effect in Doubly Rotated Quartz Resonators, by Ballato et al., ECOM 4536, 9/77.

*Primary Examiner*—Mark O. Budd
*Attorney, Agent, or Firm*—Sheldon Kanars; Jeremiah G. Murray; John T. Rehberg

[57] ABSTRACT

A stress compensated quartz piezoelectric resonator disk. The resonator contains a thin resonant center disk and a thicker integral concentric peripheral support ring. Roughly pie-slice portions of the inner disk are cut away. The remaining bridges between the resonant disk and support ring are positioned and sized in accord with crystallographic theory so that forces applied to the support ring will not change the resonant frequency of the disk.

3 Claims, 10 Drawing Figures

STRESS COMPENSATED PIEZOELECTRIC CRYSTAL DEVICE

The invention described herein may be manufactured, used and licensed by or for the Government without the payment to me of any royalty thereon.

BACKGROUND OF INVENTION

1. Field of the Invention

This invention relates generally to piezoelectric crystal devices and more particularly, to high frequency, high precision quartz crystals used in applications in which shock, acceleration, and temperature stresses are present.

2. Description of the Prior Art

Piezoelectric crystal resonators are an essential element in frequency control and determination and in other applications where an electrical resonant frequency is used. One of the most common piezoelectrics is quartz which exhibits bulk acoustic waves of the thickness shear type when properly stimulated.

Designers of apparatus employing piezoelectric crystals are often confronted with the problem of devising a suitable mounting method for the crystal. The stability of the resonant frequency of such crystals is adversely affected by shock, acceleration, and even thermal stresses, and the crystal mounting is an avenue through which such stresses may be transmitted directly to the crystal, altering resonant frequency.

Typically, these crystals are fabricated in the form of circular discs; the higher the crystal's resonant frequency, the thinner the crystal disc, and the more susceptible to damage or at least frequency shift.

U.S. Pat. No. 3,694,677 issued to Guttwein, Ballato, and Lukaszek discloses a method of constructing a high frequency resonator while still providing an adequate support structure. The patent shows how to reduce the thickness of a concentric circular portion of the center of a conventional quartz disc while leaving the thickness of the periphery untouched, thus providing an ultrathin inner resonant quartz disc surrounded by an integral, stronger, thicker peripheral support ring. The support ring is relatively robust and may be used for mounting to equipment structure(s). The thickness of the circular center portion is reduced by well known microelectronic techniques, namely photolithography and etching. The process yields an ultrathin resonator with resonant frequencies in the 1000 MHz range which can be easily mounted.

Although the patent discloses a crystal with hitherto unattainably high resonant frequencies, it is still possible for the stresses of acceleration, shock, vibration, and temperature to be transmitted directly to the thin resonant center portion of the disc from the peripheral support ring, thus adversely affecting the crystal's resonant frequency, as mentioned before.

A variety of approaches have been tried to isolate crystal resonators from their mechanical supports to maintain resonant stability. For crystals whose basic configuration is not an ultrathin disc surrounded by an integral support ring, as disclosed in aforementioned U.S. Pat. No. 3,694,677, a variety of approaches have been tried. For example, U.S. Pat. No. 4,454,443, issued to Lukaszek and Ballato, discloses a method of mounting resonators which have uniform thickness and a number of flat sides to which mounting devices may be attached, with the flat sides providing a means of evenly distributing and thus reducing mounting stresses.

French patent No. 79 18553, "Oscillateur haute frequence autothermostate" issued to Besson teaches a method of reducing the stress sensitivity of a quartz resonator by using narrow mounting bridges positioned in accord with crystallographic theory to be discussed below. However the narrow bridges are very fragile and susceptible to breakage.

Other methods used to reduce the stress sensitivity of resonators are discussed in U.S. Pat. No. 4,136,297 issued to Briese. However, all of the methods disclosed teach methods of manufacturing various types of external mounting apparatus such as spring clips, tape, cement, etc., but none teaches a quartz resonator which by its intrinsic shape is acceleration and shock resistant no matter how it is mounted. The present invention teaches such a resonator.

The following publications are pertinent to an understanding of the novel crystal fabrication technique described herein. The significance of each will be described below.

Shockley et al., "Trapped Energy Modes in Quartz Filter Crystals," *Jour. Acoustical Soc. of America,* vol. 41, No. 4 (Part 2) pp. 981–993, April 1967;

Ballato, "Force-Frequency Compensation Applied to Four-Point Mounting of AT-Cut Resonators," *IEEE Trans. Sonics Ultrason.,* Vol. SU-25, July pp. 223–226, July 1978.

Besson et al "Further Advances on B.V.A. Quartz Resonators," *Proc. 34th An. Freq. Control Symposium,* U.S. Army Electronics R&D Command, Ft. Monmouth N.J. pp. 175–182 1980;

E. P. Graf et al., "BVA Quartz Crystal Resonator and Oscillator Production," *Proc. 37th An. Freq. Control Symposium,* U.S. Army Electronics R&D Command, Ft. Monmouth, N.J. pp. 492–500 1983;

Ballato et al "Simplified Expressions for the Stress-Frequency Coefficients of Quartz Plates," *IEEE Trans. Sonics Ultrason.* Vol. SU-31, pp. 11–18, Jan 1984.

Both experimental and theoretical studies of quartz discs have shown that external forces applied to the periphery of the disc cause vibration frequency changes. Because of the anisotropy of quartz, the same force applied at different azimuth angles may cause different frequency changes. For any given crystal axis orientation a force-frequency may be defined, per Ratajski, referenced in both publications by Ballato supra:

$$K_f(\psi) = (\Delta f/f_o)(D \cdot 2h/F)(1/N)$$

where $\psi$ = azimuthal angle of applied force measured counterclockwise from crystal X-axis F = applied compressional force $\Delta f$ = frequency change caused by application of compressional force F D = resonant disc diameter 2h = thickness of resonant disc $f_o$ = nominal resonant frequency N = disc frequency constant (equal to one half the acoustic velocity, or $N = f_o \cdot h$)

Apart from the factor N, $K_f(\psi)$ is the normalized frequency shift divided by the average stress in the cross section. Or, $K_f(\psi)$ may be regarded as a proportionally factor relating the fractional frequency change, $\Delta f/f_o$, to the average stress acting across the crystal diameter, F/(2H·D). By convention, $K_f(\psi)$ is considered positive if $\Delta f$ is positive when a compressive load is applied, and negative if $\Delta f$ is negative.

Quartz resonators may be cut in a variety of ways with respect to the crystal axes. "Singly rotated" and "doubly rotated" refer to cuts oriented with respect to the crystallographic axes. For example, a doubly rotated cut is a sample which is cut at an angle $\phi$ rotated around the Z-axis of the mother crystal and then cut at an angle $\phi$ rotated around the already-rotated X axis of the mother crystal. When the angle $\phi$ is zero, the result is called a singly rotated cut.

The force freqency function, $K_f(\psi)$, has been either experimentally or theoretically determined for all singly and doubly rotated cuts of current technological interest. For the singly rotated AT cut, for example, the publication "Force-Frequency Compensation Applied to Four-Point Mounting of AT-cut Resonators" above authored by the present inventor, presents both theoretical and experimental data for $K_f(\psi)$. For doubly rotated cuts, that is, those cuts for which $\phi \neq 0$, the publication "Simplified Expressions for the Stress-Frequency Coefficients of Quartz Plates" above, co-authored by the present inventor provides $K_f(\psi)$ for $\phi = 22.4°$ (SC-cut quartz), and a technique for determining $K_f(\psi)$ for other cuts currently of lesser interest.

The publication and patent by Besson et al., and the publication by Graf et al., above, disclose a four point stress-compensating mounting for quartz resonators. The resonator is mounted by narrow 0.3 mm bridges. Each bridge encompasses a point at which $K_f(\psi) = 0$. However, the mounting technique is inherently fragile and will not withstand service stresses or accelerations.

SUMMARY OF THE INVENTION

Because the force-frequency function $K_f(\psi)$ is zero for certain specific azimuth angles $\psi$, that is, because at certain azimuthal angles $\psi$, a compressive force applied to the disc will cause no frequency change, the inventive technique described herein may be utilized to effect attachment of a resonant quartz disk to an integral peripheral support ring around those angles at which $K_f(\psi) = 0$. Consequently, any force which may be transmitted to the resonant disc from the peripheral support ring will not cause a resonant frequency change.

The inventive device is constructed by selectively etching away approximately pie-slice portions of the outer edge of the resonant disc. The angular widths of the removed material are chosen so that whatever bridges remain to connect the resonant disc to the peripheral support ring will not transmit a stress which will cause a resonant frequency shift. The bridges cannot contribute to a frequency shift because their azimuthal locations are chosen around those values of $\psi$ for which $K_f(\psi) = 0$, and their angular widths are chosen so that the average frequency change caused by stresses applied over the angular width is zero, i.e.

$$\int_{\chi_1}^{\chi_2} K_f(\chi)d\chi = 0,$$

where $(\psi_2 - \psi_1)$ = angular width.

The diametral length of the pie cuts is determined by well-known "energy-trapping" rules which prohibit the length of the cut from being so great as to interfere with the desired bulk acoustic shear vibratory mode of the crystal.

Accordingly, it is a primary object of the present invention to provide a variety of robust resonant quartz crystals whose resonant frequencies are resistant to change when external compressive forces are applied.

BRIEF DESCRIPTION OF DRAWINGS

FIG. 4 is a plan view of one of the preferred embodiments of the present invention.

FIG. 5 is a sectional view of a portion of the device of FIG. 4 cut along the line 5—5 and looking in the direction of the arrows.

FIG. 6 is a plan view of one of the preferred embodiments of the present invention.

FIG. 7 is a plan view of an alternative preferred embodiment of the present invention.

FIG. 8 is a graph showing the force-frequency function, $K_f(\psi)$, as a function of angle, $\psi$, measured from the crystal X-axis for AT-cut quartz.

FIG. 9 is another graph showing the same force frequency function, $K_f(\psi)$, as a function of angle, $\psi$, measured from the crystal X-axis, for AT cut quartz.

FIG. 10 is a graph showing the force-frequency function, $K_f(\psi)$, as a function of angle $\psi$ measured from the crystal X-axis for SC-cut quartz.

DESCRIPTION OF THE PREFERRED EMBODIMENT

Figure 1:
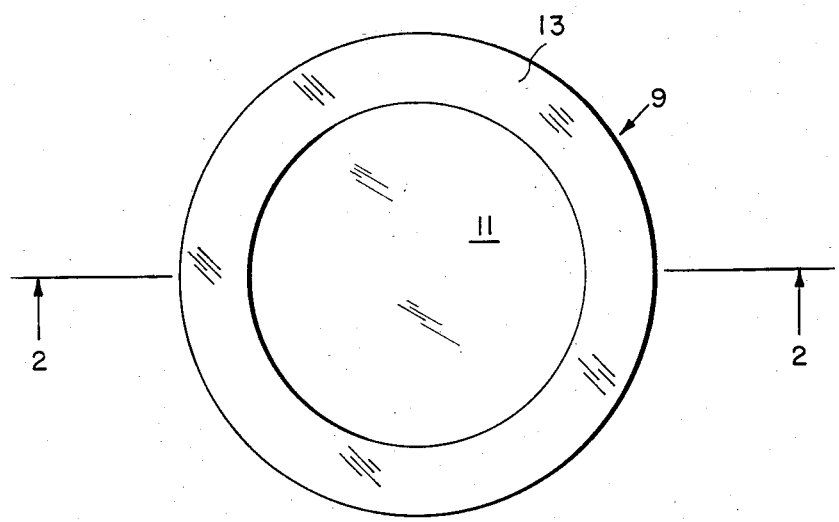
FIG. 1 is a plan view of a typical prior art device.
Figure 2:
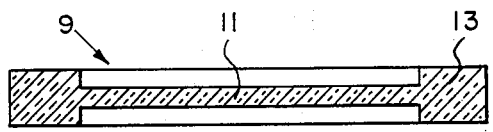
FIG. 2 is a sectional view of the device of FIG. 1 cut along the line 2—2 and looking in the direction of the arrows.

Referring to the drawings, and more particularly to FIG. 1, wherein like numerals refer to like components throughout, reference numeral 11 designates an ultra-thin quartz crystal resonant disk, well known in the prior art. The disk 11 is surrounded by a thicker integral quartz peripheral support ring 13 to form as resonator 9. FIG. 2 illustrates a sectional view of the prior art resonator 9 shown in FIG. 1. The quartz crystal resonator 9 in FIG. 2 is fabricated by etching away a circular portion of quartz material on both the upper and lower surfaces of a quartz crystal blank originally of uniform thickness to form the thin resonant disk 11 surrounded by the support ring 13.

Figure 2A:
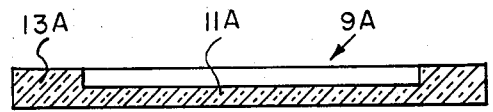
FIG. 2A is an alternative sectional view of a device similar to that shown in FIG. 1.

FIG. 2A illustrates an alternative prior art configuration. In FIG. 2A the resonator 9A is formed by removing a circular portion of quartz material from only the upper surface of the crystal blank to produce resonant disk 11A and integral support ring 13A.

Figure 3:
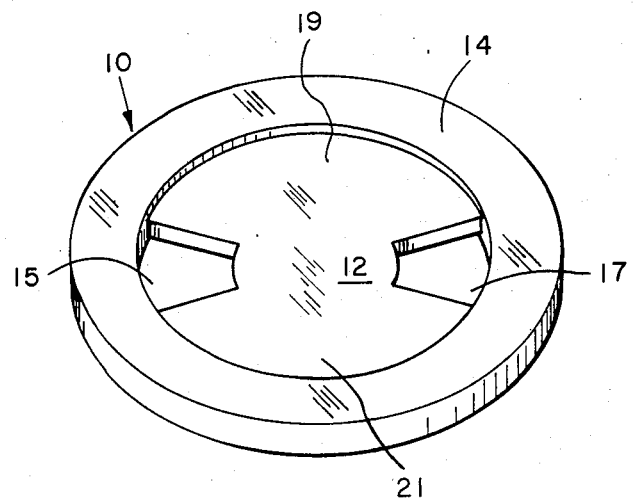
FIG. 3 is a perspective view of one of the preferred embodiments of the invention.

FIG. 3 depicts one of the preferred embodiments of the present invention. In FIG. 3 the resonator 10 includes a thin resonant quartz disk 12 surrounded by a thicker integral support ring 14. There are two roughly pie-slice shaped openings 15 and 17 between the disk 12 and the support ring 14. The disk 12 is connected to the support ring 14 by two integral bridges 19 and 21.

The preferred embodiment of FIG. 3 may be fabricated from the prior art configuration of FIG. 1 and FIG. 2 by making a mask which covers the resonant disk 11 in FIG. 1 except for areas corresponding to the pie-slice shaped openings 15 and 17. When the mask is superimposed upon the disk 11, the areas corresponding to the pie-slice shaped openings 15 and 17 are exposed. The openings 15 and 17 may be created by using standard etching or photolithography techniques to completely etch through the disk and remove the exposed material, leaving, as shown in FIG. 3, a somewhat smaller resonant disk 12 which is still connected to a peripheral support ring 14 by two bridges 19 and 21.

A similar technique may be applied to remove two pie-slice openings from the configuration of FIG. 2A.

FIGS. 4 and 5 illustrate the embodiment of FIG. 3 with first and second opposing electrodes, 36 and 38 shown respectively above and below the resonant disk 12. FIG. 4 illustrates the first electrode 36 covering a portion of the disk 12 and extending along bridge 19 and thence connecting to a terminal 39 attached to the peripheral support ring 14. The terminal 39 is contacted by a first conductive mounting bracket 41 for coupling to any desired utilization circuit. A second conductive mounting bracket 42 contacts the opposite side of the peripheral support ring 14 and makes contact with the terminal 40 of the opposite electrode 38. The mounting brackets 41 and 42 are not shown in FIG. 5 for simplicity.

FIG. 6 depicts a plan view of the preferred embodiment of FIG. 3 and together with FIGS. 8 and 9 is illustrative of the method of determining the shapes of the pie-slice openings 15 and 17 and the orientation of the openings 15 and 17 with respect to the crystal X and Z' axes.

For convenience, the disk 12 may be described as being bounded by the circular free edges 16 and 18 and by imaginary first and second reference lines 24 and 26 formed by extension of the circular free edges 16 and 18 so that a complete circle with center 29 is defined by a combination of the edges 16 and 18 and the reference lines 24 and 26.

The first bridge 19 is bounded by first and second free edges 28 and 30 and the second bridge 21 is bounded by first and second free edges 32 and 34.

The diameter of the resonant disk 12, that is, the distance between the free edges 16 and 18, is chosen in accord with energy trapping rules, well known to those skilled in the art and explained in the publications by Shockley et al above. When the distance between the free edges 16 and 18 is chosen in accord with the aforementioned energy trapping rules, the vibratory energy of the desired thickness shear mode is essentially confined within the disk 12 and exhibits exponential decay outside the reference lines 24 and 26 in the bridges 19 and 21. The exponential decay is not associated with energy loss, but instead acts to trap the oscillating energy within the disk 12.

A practical rule of thumb for estimating the minimum distance between the free edges 16 and 18 is:

$$D = 15 \times b$$

where:

D = distance between free edges 16 and 18
b = thickness of resonant quartz disk

Typically, for a resonant quartz disk of AT-cut orientation, and frequency 100 MHz, the thickness of the disk 12 is approximately 16.6 micrometers; in accord with the above formula, the distance between the free edges 16 and 18 should not be less than 0.25 millimeters.

FIG. 8 presents a graph of $K_f(\psi)$ for AT cut quartz for various azimuthal angles $\psi$ in the X-Z' plane about the center 29 of crystal 10 and measured counter clockwise from the X axis as viewed in FIG. 6. The units of $K_f(\psi)$ are $10^{-15}$ meter sec/Newton. The following will illustrate in detail how, as mentioned before, the angular width of the bridges 19 and 21 and the orientation of the bridges 19 and 21 with respect to the crystal X-axis can be chosen so that the integral of the crystal force-frequency function $K_f(\psi)$ shown in FIG. 8 over the angular width of the bridges 19 and 21 is zero. As discussed previously, when the integral of the force frequency function, $K_f(\psi)$, over the angular width of the bridges is zero forces which may be transmitted to the resonant disk 12 via the bridges 19 and 21 will not change the resonant frequency of the disk 12.

The graph of FIG. 8 has a minimum at $\psi = 90°$ and is symmetric about $\psi = 90°$. Also, $K_f(\psi) = 0$ for $\psi = 62.0°$ and 111.6°. Further, the crystal is symmetric for 180° rotations and therefore $K_f(\psi) = 0$ for $62.0° + 180° = 291.6°$ and $K_f(\psi) = 0$ for $\psi = 111.6° + 180° = 291.6°$.

Thus, as mentioned before, compressive forces applied to the resonant disk 12 at the four azimuthal angles at which $K_f(\psi) = 0$, namely $\psi = 62.0°, 111.6°, 242.0°$ and 291.6° will ideally not cause a shift in the resonant frequency. If the disk 12 were connected to the support ring 14 with "point" mounts at the four azimuthal angles, $\psi = 62.0°, 111.6°, 242.0°,$ and 291.6° any forces transmitted to the disk 12 would not affect the crystal resonant frequency. The patent and article by Besson et al. and the publication by Graf et al., attempt to utilize the above principle by connecting a resonant disk to a supporting ring with 0.3 mm bridges. However, "point" mounts are not always desireable because they are very thin and prone to breakage because of the very high stresses developed due to small cross sectional areas.

There is no provision in the disclosures of Besson et al. for choosing the widths and azimuthal locations of the bridges so that the integral of the crystal force-frequency function, $K_f(\psi)$, is zero.

The present invention teaches the use of wide, strong mounting bridges whose widths and azimuthal locations are chosen so that the integral of the force-frequency function, $K_f(\psi)$, is zero. Thus, the goal of frequency stability is achieved without sacrificing mechanical strength. The integral mounting bridges 19 and 21 are stronger than "point" contacts, and provide more reliable mechanical connection between the resonant disk 12 and the peripheral support ring 14. The angular width spanned by each bridge, 19 or 21, includes at least one of the above mentioned angles at which $K_f(\psi) = 0$. The angular widths and azimuthal positions of the bridges 19 and 21 are chosen so that forces transmitted to the disk 12 via the bridges 19 and 21 cannot cause a change in the frequency of the disk 12. The resonant frequency cannot change because, as mentioned before, the angular widths and positions of the bridges 19 and 21 are chosen so that $$\int_{\chi_1}^{\chi_2} K_f(\chi) d\chi = 0$$

where $\psi_2$ and $\psi_1$ correspond to the angular positions of the edges of the bridges and $(\psi_2 - \psi_1)$ denotes the angular width of the bridge.

FIG. 8 provides an example of the manner in which the angular width and position of a bridge may be calculated. An analytic expression for $K_f(\psi)$ for AT-cut quartz as shown in FIG. 8 is given in both publications by Ballato above. In FIG. 8 two areas 31 and 33, of equal magnitudes are illustrated. The area denoted 31 is a positive area, being above the line $K_f(\psi)=0$. The line 48 demarcates the left limit of integration, $\psi_1$, and intersects the horizontal axis at $\psi_1=52.0°$, the line 49 demarcates the right limit of integration, $\psi_2$, and intersects the horizontal axis at $\psi_2=72.3°$. Thus, FIG. 8 illustrates that:

$$\int_{52.0°}^{72.3°} K_f(\chi)d\chi = 0$$

Consequently, one bridge suitable for the practice of this invention would extend from $\psi=52.0°$ to 72.3° and would have an angular width of $72.3°-52.0°=20.3°$.

Clearly, the greater the angular width of the connecting bridges 19 and 21, (FIG. 6), the greater the mechanical support for the resonant disk 12, and the less the risk of connecting bridge breakage. The angular widths and positions of the bridges, of course, must be chosen so that positive and negative areas on the graph of $K_f(\psi)$ cancel as illustrated in FIG. 8, and the preceding discussion. FIG. 9 illustrates a method of maximizing bridge width, thus obtaining good mechanical support for the disk 12, yet obtaining the advantages of the present invention, FIG. 9 thus represents the basis for one of the preferred embodiments for of the present invention AT-cut quartz. FIG. 9 depicts the same force-frequency function $K_f(\psi)$ for AT-cut quartz as shown in FIG. 8, although FIG. 9 is illustrative of integration over a wider angular range than shown in FIG. 8. In FIG. 9 four areas 35, 37, 55, and 56 are depicted. Two areas, 35 and 56, being above the line $K_f(\psi)=0$, are positive, and the remaining two areas 37 and 55, being below the line $K_f(\psi)=0$, are negative. Furthermore, the magnitudes of areas 35 and 37 are equal, and the magnitudes of areas 55 and 56 are equal. Reference line 50 demarcates the left limit of area 35 and intersects the horizontal axis at 40.4°; reference line 54 demarcates the right limit of area 56 and intersects the horizontal axis at 139.6°. Thus: (area 35)+(area 37)+(area 55)+(area 56)=0, or expressed more conventionally:

$$\int_{40.4°}^{139.6°} K_f(\chi)d\chi = 0$$

Therefore, the total angular width of one bridge in a preferred embodiment of the present invention is from 40.4° to 139.6°. FIG. 6 is illustrative of the preferred embodiment of FIG. 9. The angular width spanned by the bridge 19, that is the angular width between the edges 28 and 30, is from 40.4° to 139.6°.

Because of crystal symmetry, 180° rotation of the above-described connecting bridge yields another bridge with angular widths from 220.4° to 319.6°. That is, taking the angular limits of the bridge 19, namely 40.4° and 139.6° and adding 180° to each of them produces the angular limits of the bridge 21 e.g. and $40.4°+180°=220.4°$ and $139.6°+180°=319.6°$.

In FIG. 6 the angular width spanned by the bridge 21, that is, the angular width between the edges 34 and 32 is from 220.4° to 319.6°. Thus, FIG. 6 is illustrative of the relative shapes and orientations with respect to the crystal X-axis of the connecting bridges 19 and 21. An AT-cut crystal configured as illustrated by FIG. 6 may be mounted via its peripheral support ring 14 with confidence that the resonant disk 12 is adequately supported, yet without fear that mounting forces applied to the peripheral support ring 14 will induce resonant frequency change.

In FIG. 6 the two connecting bridges encompass the crystal Z'-axis which is at 90° relative to the X-axis. For AT-cut quartz, various crystal vibratory modes which are undesirable for some applications, travel along the Z' direction. These modes travel outward from the resonant disc 12 when it is electrically stimulated and are reflected back toward the disc 12 from the support ring 14. Such undesired modes complicate the vibration of the crystal and reduce the Q of the system.

Consequently, it may be desirable for certain applications if the path along the Z' axis were removed from the bridges 19 and 21 to prevent propagation of unwanted Z' axis modes. FIG. 7 illustrates such an alternative preferred embodiment. In FIG. 7 a resonator 70 is depicted. The resonator 70 has a peripheral support ring 74 and an active resonator plate 100 comparable to the disk 12 in FIG. 6. There are four pie-slice shaped openings, 76, 77, 78 and 79. Two openings, 77 and 79 are bisected by the X-axis, and two openings 76 and 78 are bisected by the Z' axis. The openings 76 and 78 serve to prevent the transmission of vibration along the Z-axis. The angular width of each of the openings 77 and 79 is denoted by $\alpha$. The angular width of each of the openings 76 and 78 is denoted by $\beta$. There are four connecting bridges 81, 82, 83, and 84.

The angular width and position of each of the connecting bridges 81, 82, 83 and 84 is determined in a manner similar to that discussed already and employed in calculating the width of each of the bridges 19 and 21 in FIG. 6. However, care must be taken that the angles 90° and 270° are not included in the angular width of any bridge. For example it has been already noted that $K_f(\psi)=0$ in FIGS. 8 and 9 for $\psi=62.0$; 111.6°, 242.0° and 291.6°. The widths and positions of the four bridges 81, 82, 83, and 84 may thus be chosen according to the following equations:

bridge 82: $\int_{\chi_1}^{62.0°} K_f(\chi)d\chi + \int_{62.0°}^{\chi_2} K_f(\chi)d\chi = 0$ $\chi_2 < 90°$
angular width $= \chi_2 - \chi_1$ bridge 81: $\int_{\chi_3}^{111.6°} K_f(\chi)d\chi + \int_{111.6°}^{\chi_4} K_f(\chi)d\chi = 0$ $\chi_3 > 90°$
angular width $= \chi_4 - \chi_3$ bridge 84: $\int_{\chi_5}^{242.0°} K_f(\chi)d\chi + \int_{242.0°}^{\chi_6} K_f(\chi)d\chi = 0$ $\chi_6 < 270°$
angular width $= \chi_6 - \chi_5$ bridge 83: $\int_{\chi_7}^{291.6°} K_f(\chi)d\chi + \int_{291.6°}^{\chi_8} K_f(\chi)d\chi = 0$ $\chi_7 > 270°$
angular width $= \chi_8 - \chi_7$ These equations which embody the inventive principles already taught in the foregoing paragraphs insure that the Z'-axis will not be present in any bridge by requiring that the limits of integration $\psi_2$ and $\psi_3$ cannot equal 90° and by requiring that the limits of integration, $\psi_6$ and $\psi_7$ cannot equal 270°.

In FIG. 7, the openings 77 and 79 have an angular widths $\alpha$. The angular widths $\alpha$ of the openings 77 and 79 and the angular widths $\beta$ of the openings 76 and 78 may be expressed in terms of the integration limits discussed above by the formulas:

$$\alpha = 2\psi_1$$

$$\beta = \psi_3 - \psi_2 = \psi_7 - \psi_6$$

Some representative values of for the angles $\alpha$ and $\beta$ shown in FIG. 7 for AT-cut quartz are given in Table 1 below:

TABLE I

| $\alpha$° | $\beta$° |
|---|---|
| 80.8 | 0 |
| 83.2 | 4 |
| 85.6 | 8 |
| 88.0 | 12 |
| 90.8 | 16 |
| 93.6 | 20 |
| 96.4 | 24 |
| 99.2 | 28 |
| 102.4 | 32 |
| 105.6 | 36 |
| 108.8 | 40 |
| 112.4 | 44 |
| 116.0 | 48 |
| 120.0 | 52 |
| 121.6 | 54 |
| 123.6 | 56 |

The entire scheme may be positioned relative to the crystal axes by noting that the X-axis bisects the angle $\alpha$. It may be noted that the two-bridge configuration of FIG. 6 corresponds to the condition $\beta=0$ in Table 1. For $\beta \neq 0$, the four-bridge configuration shown in FIG. 7 results.

As $\beta$ approaches 56° and $\alpha$ approaches 124°, $(\alpha+\beta)$ approaches 180°, and the angular width of the support bridges vanishes and a four-point support structure obtains as illustrated by the last line of Table 1. For values of $\beta$ intermediate in Table 1, one obtains good mechanical support for the plate, elimination of unwanted Z' axis modes, and room for electrode which, of course, must be positioned along the bridges in a manner analogous to that shown in FIGS. 4 and 5.

Openings 76 and 78 in FIG. 7 are bounded by free edges 90 and 91 respectively and openings 77 and 79 are bounded by free edges 92 and 93 respectively. The distance between edges 90 and 91 may be slightly different than the distance between edges 92 and 93 because, as is well known to these skilled in the art, energy trapping rules are somewhat dependent upon crystal elastic constants, which for an anisotropic material like quartz, vary with axial direction.

The foregoing discussion has illustrated in detail the application of the present invention to AT-cut quartz. However, the technique may be applied to all quartz cuts. Indeed it may be applied to any piezoelectric for which the crystallographic force-frequency function is known or can be determined.

One additional example will suffice. FIG. 10 is a graph of $K_f(\psi)$ for SC cut quartz. It will be noted that $K_f(\psi)=0$ for $\psi_0=81.35°$ and 170.28°, and thus the graph is not symmetric like the graphs of FIGS. 8 and 9 for AT-cut quartz. Consequently, the bridge locations, will not be symmetrically distributed. Table 2 below provides four typical bridge widths and locations for the SC cut in accord with the teaching of the present invention.

TABLE 2

| (SC-cut quartz crystal) | | | |
|---|---|---|---|
| $\chi_0$ | $\chi_1$ | $\chi_2$ | $(\chi_2 - \chi_1)$ angular width of bridge |
| 81.35° | 66.35° | 97.40° | 31.05° |
| 170.28° | 160.68° | 180.28° | 19.60° |
| 261.35° | 246.35° | 277.40° | 31.05° |
| 350.28° | 340.68° | 360.28° | 19.60° | note
$K_f(\chi_0) = 0$;

$\chi_2$ and $\chi_1$ chosen so that $\int_{\chi_1}^{\chi_2} K(\chi)d\chi = 0$ $\chi = 0$ on crystal X-axis
$\chi_1 < \chi_0 < \chi_2$ The SC and AT cuts are the cuts of greatest current technological significance, but it should be noted that the present invention may be applied to other cuts, such as the FC cut ($\phi=15°$) or IT cut ($\phi=19.1°$) as well. Indeed the present invention may be applied to any quartz crystal cut for which $K_f(\psi)$ is known and for which $K_f(\psi)$ has both positive and negative values so that positive and negative integrals may be offset. The 1984 publication by Ballato above, the present inventor, provides a means for obtaining $K_f(\psi)$ for quartz for arbitrary angles of $\phi$.

The illustrative embodiments presented herein are merely a few of the possible variations which will occur to those skilled in the art while using the inventive principles described herein. Accordingly, numerous varitions of the invention are possible while staying within the spirit and scope of the invention as defined in the following claims.

What is claimed is:

1. A piezoelectric crystal comprising:

a piezoelectric resonant plate having a periphery and having a crystallographic force-frequency function, said crystallographic force-frequency function being zero for at least one null point on said periphery and the mathematical integral of said periphery being non-zero;

a supporting member positioned adjacent to but spaced separately from said plate; and at least one supporting bridge coplanar with said plate and connected to a first position of said periphery, said first portion including at least one said null point, the angular span of said bridge being asymmetrically positioned about said null point and the mathematical integral of said crystallographic force-frequency function over said first portion being zero; and at least one second portion of said periphery hanging free.

2. A piezoelectric crystal comprising:

an AT-cut quartz resonant disk of diameter greater than fifteen times its thickness, said disk having a crystal X-axis in the plane of said disk;

a thicker concentric support ring; and two bridges coplanar and integral with and connected between the periphery of said resonant disk and said support ring, said bridges being positioned with respect to said crystal X-axis to span the angular ranges 40.4° to 139.6° and 220.4° to 319.6°, the remainder of said periphery of said disk hanging free.

3. A piezoelectric crystal comprising:
an SC-cut quartz resonant disk of diameter greater than fifteen times its thickness, said disk having a crystal X-axis in the plane of said disk;
a thicker concentric support ring; and
four bridges coplanar and integral with and connected between the periphery of said resonant disk and said support ring, said bridges being positioned with respect to said crystal X-axis to span the angular ranges 66.35° to 97.40°, 160.68° to 180.28°, 246.35° to 277.40°, and 340.68° to 360.28°, the remainder of said periphery of said disk hanging free.

* * * * *